United States Patent [19]
Chen et al.

[11] Patent Number: 5,512,836
[45] Date of Patent: Apr. 30, 1996

[54] SOLID-STATE MICRO PROXIMITY SENSOR

[76] Inventors: Zhenhai Chen, 282 Grove St., #7, Newton, Mass. 02166; Ren C. Luo, 1010-B2 Avent Hill, Raleigh, N.C. 27606

[21] Appl. No.: 280,799

[22] Filed: Jul. 26, 1994

[51] Int. Cl.$^6$ .................................................. G01R 27/26
[52] U.S. Cl. ........................ 324/687; 324/663; 361/278; 361/280
[58] Field of Search ..................... 324/662, 663, 324/671, 687, 690; 361/278, 280, 281

[56] References Cited

U.S. PATENT DOCUMENTS

| | | | |
|---|---|---|---|
| 2,219,497 | 10/1940 | Stevens et al. | 175/183 |
| 3,278,843 | 10/1966 | Deming | 324/687 |
| 3,328,653 | 6/1967 | Wolf | 361/278 |
| 3,400,331 | 9/1968 | Harris | 324/61 |
| 3,515,987 | 6/1970 | Zurbrick et al. | 324/61 |
| 3,706,919 | 12/1972 | Abbe | 317/246 |
| 4,090,092 | 5/1978 | Serrano | 307/116 |
| 4,183,060 | 1/1980 | Barnette et al. | 358/128 |
| 4,230,967 | 10/1980 | Holz et al. | 315/3 |
| 4,380,040 | 4/1983 | Posset | 361/280 |
| 4,711,128 | 12/1987 | Boura | 73/517 |
| 4,731,694 | 3/1988 | Grabner | 361/280 |
| 4,766,368 | 8/1988 | Cox | 324/61 |
| 4,937,694 | 6/1990 | Weber | 361/280 |
| 4,982,333 | 1/1991 | Ackerman et al. | 364/468 |
| 5,055,838 | 10/1991 | Wise et al. | 340/870 |
| 5,072,190 | 12/1991 | Martin | 324/663 |
| 5,101,669 | 4/1992 | Holm-Kennedy | 361/278 |
| 5,208,544 | 5/1993 | McBrearty et al. | 324/663 |
| 5,293,131 | 3/1994 | Semones et al. | 324/687 |

FOREIGN PATENT DOCUMENTS

| | | | |
|---|---|---|---|
| 0175076 | 6/1953 | Austria | 324/687 |
| 0033652 | 3/1978 | Japan | 324/687 |

*Primary Examiner*—Maura K. Regan
*Attorney, Agent, or Firm*—Richard E. Jenkins

[57] ABSTRACT

A solid-state fringe effect capacitive proximity sensor is described which lends itself to use for surface mounting and other space constrained applications. The sensor comprises an insulating substrate having a plurality of sensing electrodes formed thereon and without any screen elements therebetween. The electrodes are adapted to measure the proximity distance of a target object (conductive or non-conductive) by means of the fringe capacitance effect created between the electrodes. Capacitance measurement processing circuitry is electrically connected to the plurality of sensory electrodes.

23 Claims, 19 Drawing Sheets

(PRIOR ART)

Key: E=Electrode
     O=Object
     SCR=Screen

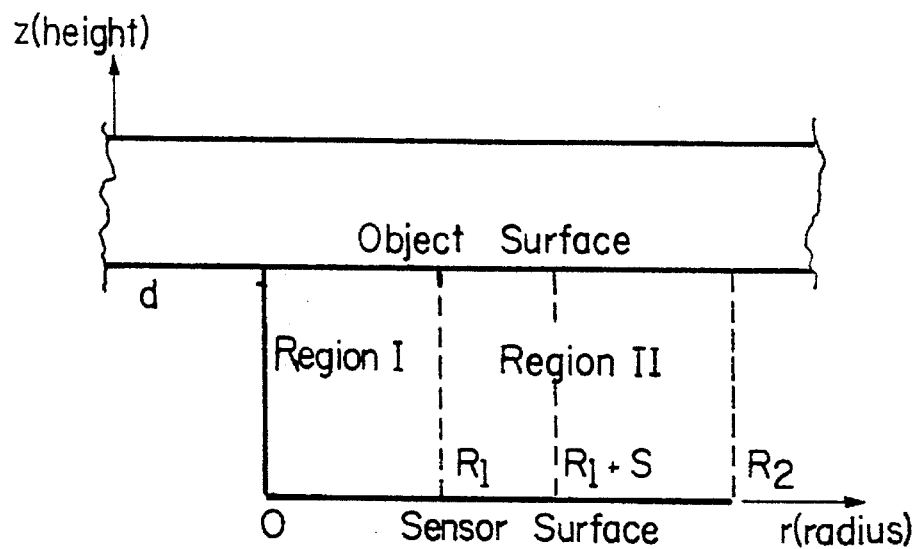
FIG. 5
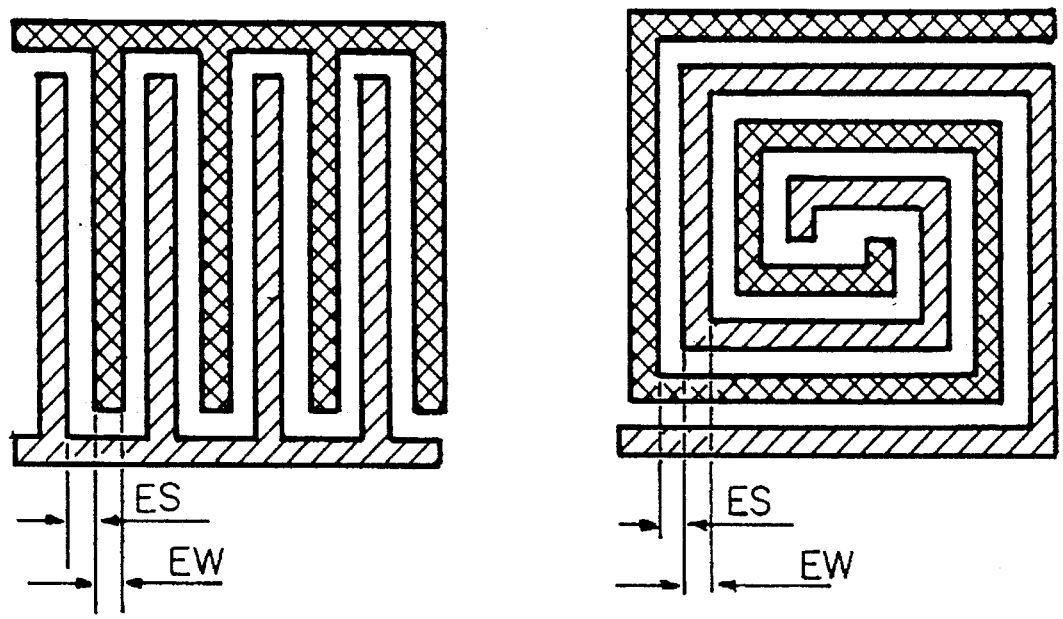
FIG. 6A
FIG. 6B

▨ CONDUCTOR  ☐ INSULATOR

SOLID-STATE MICRO PROXIMITY SENSOR

TECHNICAL FIELD

The present invention relates to target object proximity sensors, and more specifically to fringe effect capacitive target object proximity sensors.

RELATED ART

The rapid advancement in solid-state technology has made microsensors a new and exciting area for research and development. Solid-state technology provides the opportunity to integrate sensors with their processing circuitry to form so called "smart sensors". This integration not only makes the sensor more reliable and less prone to interference from the environment, but also makes the sensor easier to use since the end user does not need to design and build their own sensor processing circuitry. With the solid-state technology, it is also possible to create a multi-functional sensor by integrating multiple sensing functions into one compact unit.

With respect now to applicants' novel proximity sensor, for many practical applications, accurate measurement of small changes in distance between two parts is required. The range of measurement could be anywhere from micrometers to millimeters with desired accuracy of a few percent of the measuring range. Several techniques are currently available for measuring the proximity distance of an object to the measuring sensor. In many cases, the measurement must be performed without making contact with the object, whether due to the object having a special surface coating, or due to the object being constantly moving.

There are basically two types of capacitive proximity sensors. One uses the principle of parallel plates capacitor, the other uses the principle of fringe capacitance. For the parallel plates-type proximity sensor, the sensor forms one plate and the object to be measured forms the other plate.

Despite its many applications, the parallel plates type proximity sensor inherently possesses three major constraints: (1) the object being measured must be a conductor; (2) the inverse gap-capacitance relationship is highly non-linear and the sensitivity drops significantly in the case of larger gaps; and (3) it is impossible to use this kind of sensor in applications when one part of the pair whose separation is to be measured is inaccessible (for instance, the part is rotating or has a special coating).

The second type of the capacitive proximity sensor uses the principle of fringe capacitance. The sensor has two "live" electrodes, separated by a grounded screen. The object being measured does not need to be part of the sensor system. The target object can either be a conductor or non-conductor.

A capacitive proximity gauge based on the principle of fringe capacitance was first proposed by Noltingk. Two sensing structures were constructed. The first structure had two rectangular electrodes and a grounded screen therebetween. The second structure had a ring-shaped sensing pattern with one inner circular and one outer annular electrode and an annular grounded screen separating the two electrodes. Since both structures were constructed by conventional mechanical methods, they were large in physical size. There were no models and analytical studies conducted for either sensor structure though the measurement results did show the effects of some geometrical parameters on the characteristics of the sensor.

DISCLOSURE OF THE INVENTION

In accordance with the present invention, applicants provide a solid-state fringe effect capacitive proximity sensor comprising an insulated substrate having a plurality of sensing electrodes formed thereon in closely spaced relationship and without any screen elements therebetween. The electrodes are adapted to measure the proximity distance of a target object by means of the fringe capacitance effects created between the electrodes. Finally, the sensor includes capacitance measurement processing circuitry electrically connected to the plurality of sensory electrodes.

It is therefore an object of the present invention to provide a solid-state proximity sensor which is small in size so as to lend itself to surface mounting as well as other space-constrained locations.

It is another object of the present invention to provide a solid-state proximity sensor which includes capacitance measurement processing circuitry integrated with the sensor itself so as to form a "smart sensor".

It is still another object of the present invention to provide a solid-state proximity sensor adapted to measure the proximity distance of a target object by means of the fringe capacitance effects and which is highly reliable and accurate as well as very economical in cost.

It is still another object of the present invention to provide a solid-state proximity sensor providing high resolution, high uniformity and very small size so as to be very versatile in both the micro scale applications as well as conventional industrial applications.

It is still another object of the present invention to provide a solid-state proximity sensor which can be surface mounted so as to facilitate mounting on surfaces of machine parts and the like without modifying or changing the machine parts or the like.

It is yet another object of the present invention to provide a solid-state proximity sensor which is capable of giving precise measurement of target object proximity in a wide distance range spectrum ranging from micrometers to millimeters.

Some of the objects of the invention having been stated, other objects will become evident as the description proceeds, when taken in connection with the accompanying drawings described hereinbelow.

DESCRIPTION OF THE DRAWINGS

FIG. 5 shows a cross-sectional view of applicant's ring-shaped proximity sensor model with a cylindrical coordinate system;

FIGS. 6A–6C show schematic drawings of three (3) sensing patterns for applicants' proximity sensor comprising a comb pattern, spiral pattern, and square-D pattern, respectively;

BEST MODE FOR CARRYING OUT THE INVENTION

Figure 1A:
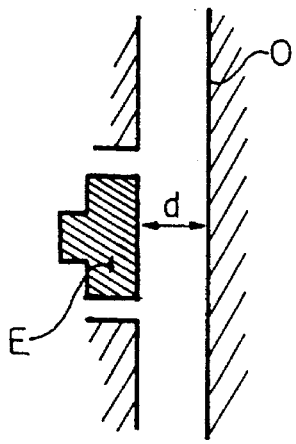
FIG. 1A shows a prior art parallel plates capacitive proximity sensor wherein the object to be measured acts as one of the parallel plates.
Figure 1B:
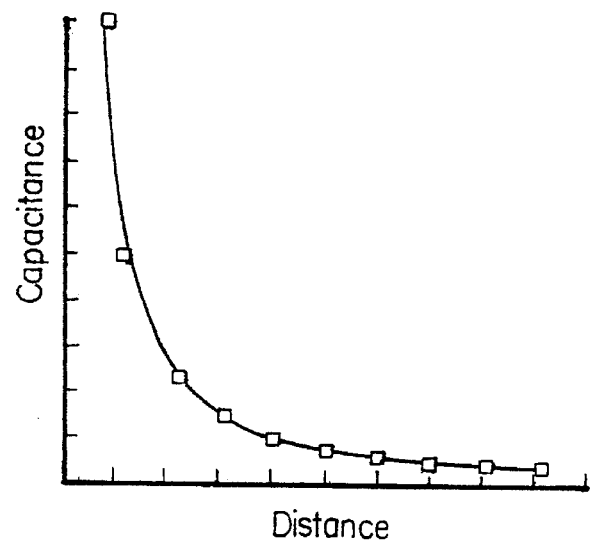
FIG. 1B shows a typical response of the prior art sensor of FIG. 1A.
Figure 2A:
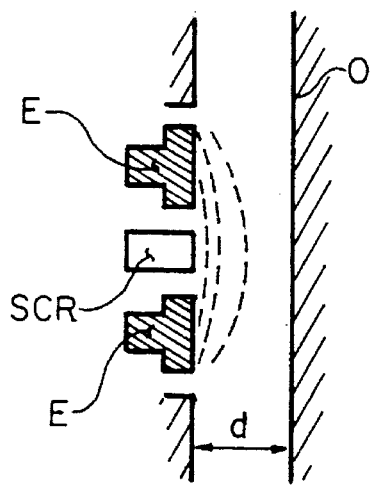
FIG. 2A shows a prior art fringe capacitive proximity sensor with a screen between the electrodes.
Figure 2B:
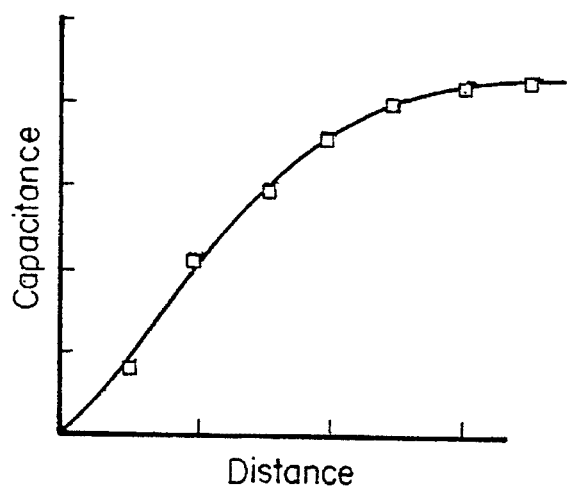
FIG. 2B shows a typical response of prior art sensor 2A.
Figure 3:
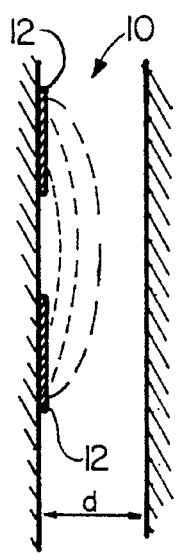
FIG. 3 shows applicants' novel fringe effect capacitive proximity sensor.
Figure 4A:
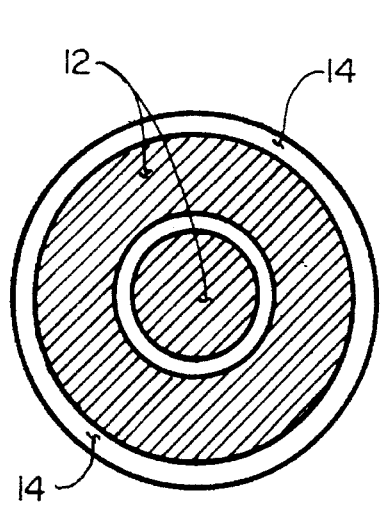
FIG. 4A shows a plan view of applicants' ring-shaped proximity sensor.
Figure 4B:
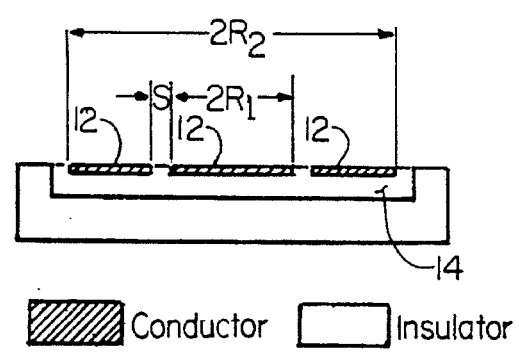
FIG. 4B shows a cross-sectional view of applicants' ring-shaped proximity sensor.
Figure 6C:
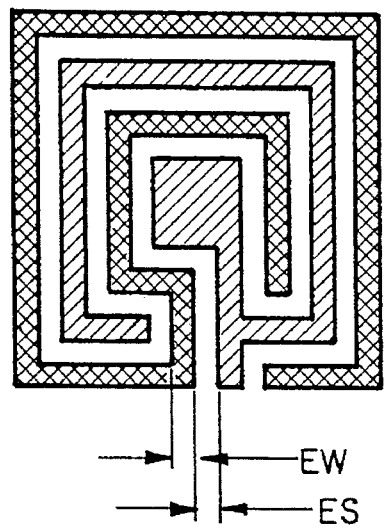
Figure 8A:
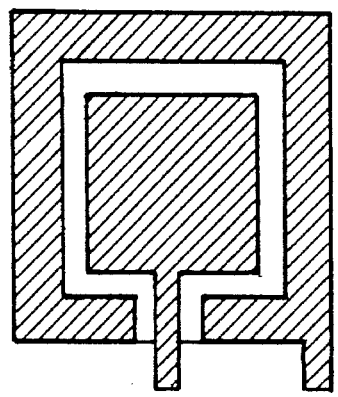
FIGS. 8A–8D show schematic drawings of top plan and vertical cross-sectional views of applicants' proximity sensor with a square-shaped sensing patterns 1 and 2, respectively.
Figure 8B:
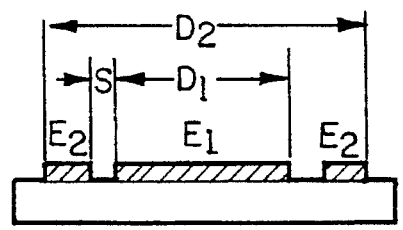
Figure 8C:
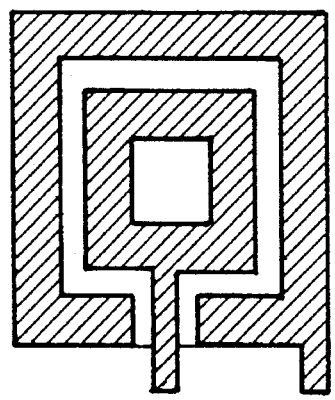
Figure 8D:
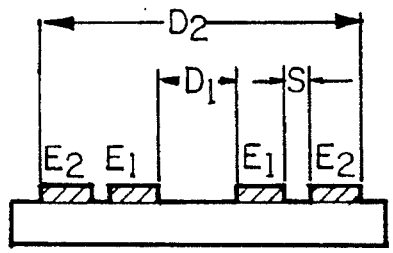
Figure 7A:
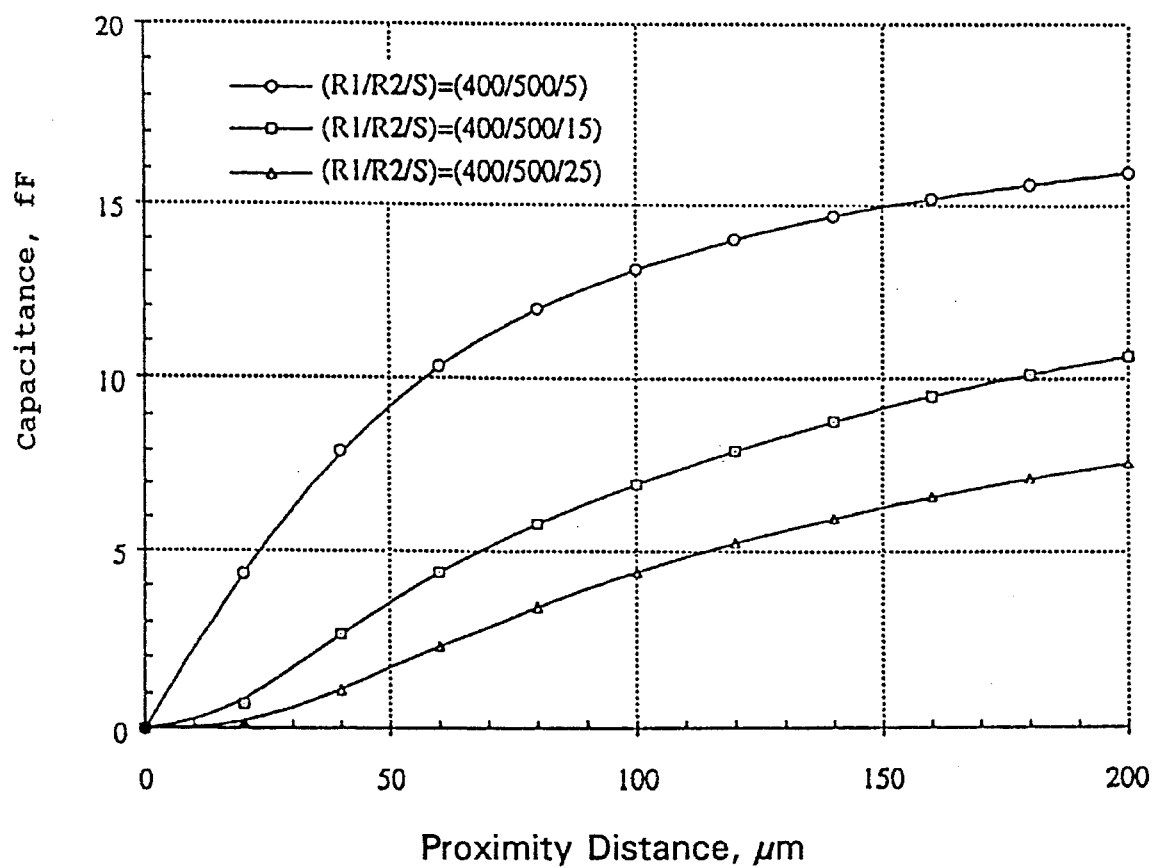
FIGS. 7A–7C show simulation results of applicants' proximity sensor with a closed form sensory model by varying electrodes separation S only, varying both electrodes separation S and the radius of inner electrode $R_1$, and showing the effects of varying effective electrode length by changing inner electrode radius $R_1$ only, respectively.
Figure 7B:
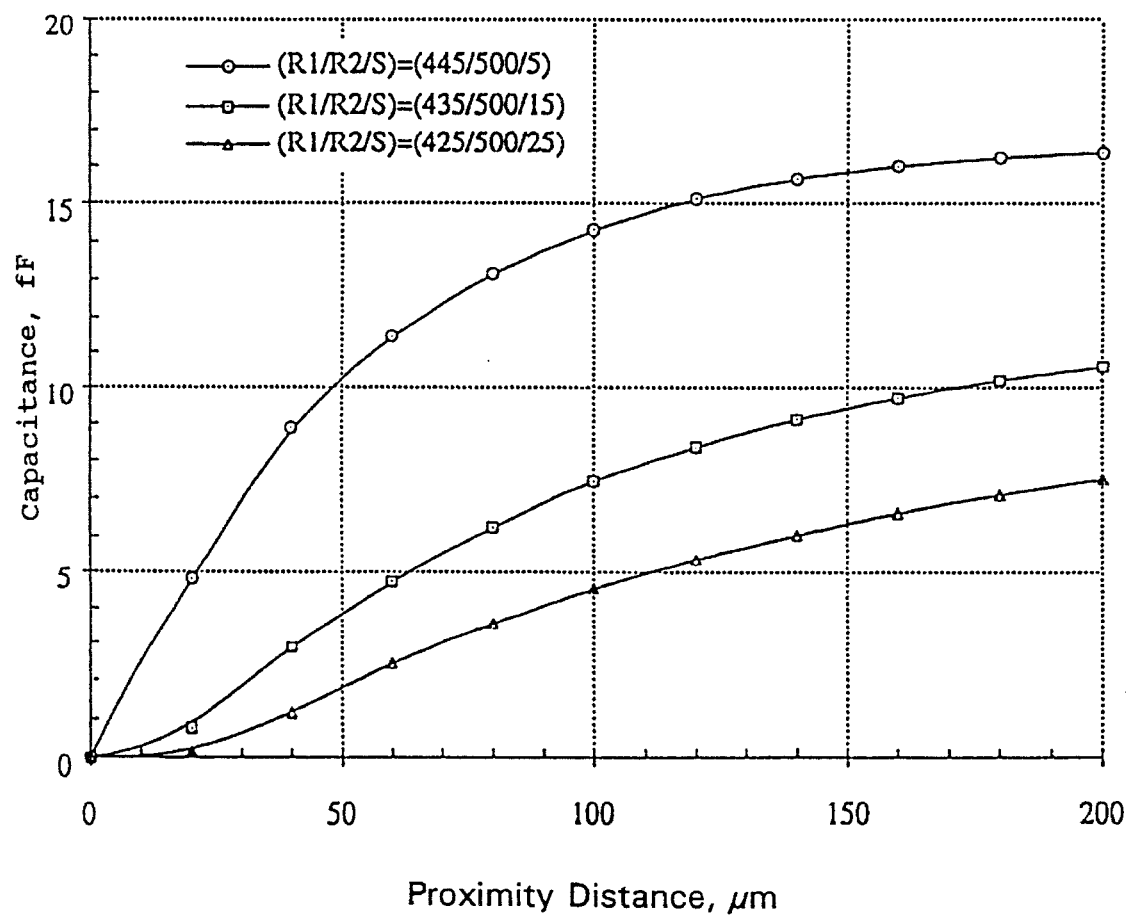
Figure 7C:
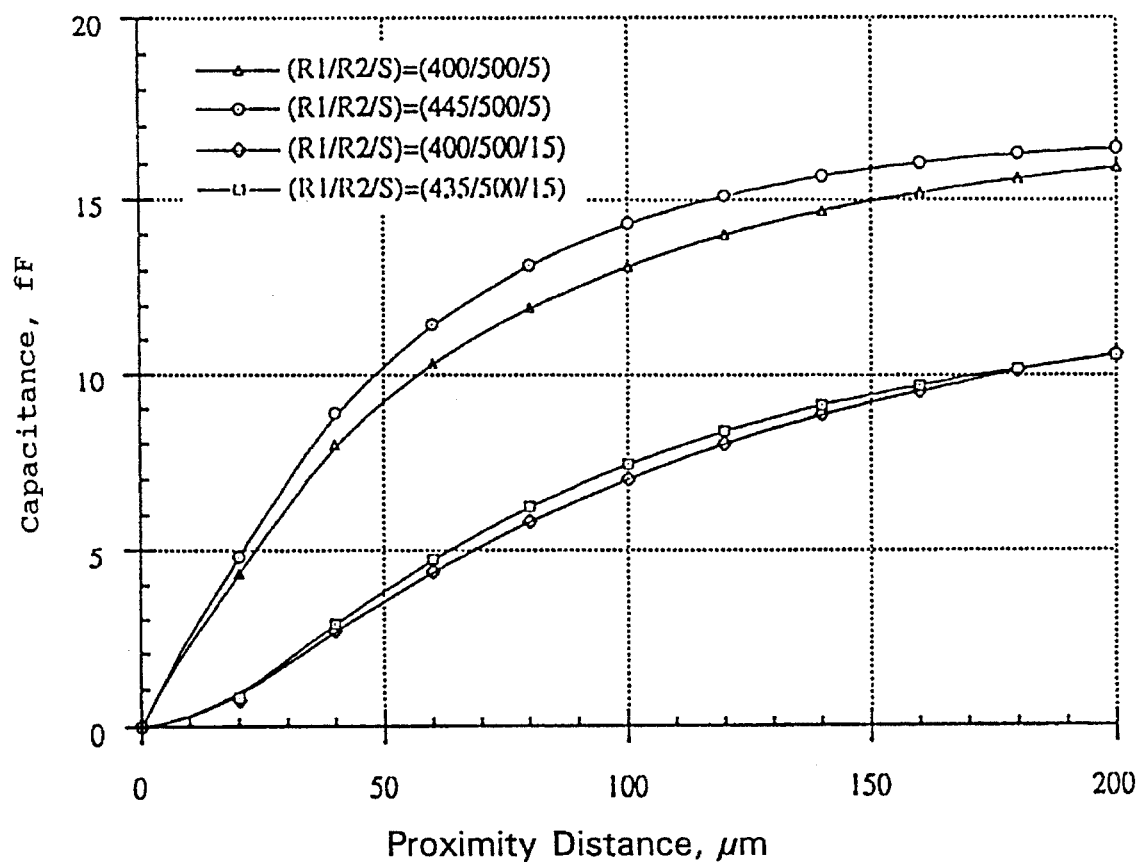

Referring now to FIGS. 1–17, an innovative micro capacitive proximity sensor 10 is shown in FIG. 3 which illustrates the basic structure and the working principle of the sensor. Proximity sensor 10 has a much simpler structure compared with the one introduced by Noltingk (FIG. 2A). The sensor is designed to be fabricated by the solid-state technology. The sensor electrodes 12 are made very thin relative to the other physical dimensions so that the normal capacitance is almost negligible compared with the fringe capacitance for the proposed design. The grounded metal screen which was necessary in the conventional design is no longer needed. This new design not only simplifies the sensing structure and increases the usable sensing area, but it also provides the opportunity to bring two "live" electrodes 12 closer together in the range of 1 μm to the width of electrode, depending on the application desired. Bringing electrodes 12 closer together increases the fringe effects, and that in turn increases the sensor sensitivity.

The proposed proximity sensor could be fabricated on various solid insulating substrates 14 such as sapphire ($Al_2O_3$) wafer and silica ($SiO_2$) wafer or on flexible insulating films such as the polyimide films. Prototype proximity sensors 10 have been fabricated on both silica substrate and flexible polyimide films. The basic fabrication procedures for each substrate material are described hereinafter.

For the silica substrate, the fabrication starts with sputtering a thin layer of chrome on substrate 14. Proximity sensors 10 are subsequently patterned by the photolithography method and followed by the etch of chrome.

There are varieties of polyimide films with a wide range of mechanical and electrical properties which can be used. The fabrication starts with sputtering a thin layer of chrome on the polyimide film, followed by sputtering a thin layer of gold onto the chrome layer. Proximity sensors 10 are subsequently patterned by the photolithography method and followed by the etch of gold and chrome. The reasons for two metal layers (chrome and gold) is that gold does not adhere to the polyimide film very well but chrome adheres to the polyimide film very well. Chrome has problems when using monostropic heat seal connectors to link to the outside world but gold does not have such problems when connecting to the outside world with the monostropic heat seal connectors. The combination of chrome and gold layers has solved both problems.

Test Results

In order to prove the efficacy of the invention and to verify the simulation results, applicants fabricated and tested sensor prototypes in their microelectronics laboratory as described in detail hereinafter.

Prototype proximity sensors 10 were fabricated including two square-shaped patterns, a comb pattern and a spiral pattern. FIG. 8A–8D shows a schematic drawing of the two square-shaped patterns with both cross-sectional and top views of the sensor structures and includes the definitions of the sensor geometrical parameters.

Measurements on prototype proximity sensors 10 fabricated on silica substrate 14 have been carried out by applicants by using a custom design test station a WENTWORTH LABS probe station and a HP4280A precision capacitance MITUTOYO Meter/Plotter. The test station contains a high resolution micrometer which can provide proximity distance measurements with 1 μm resolution. The micrometer head acts as the approaching object relative to the proximity sensor and is kept at ground potential throughout the measurement process. The capacitance contribution of substrate material 14 is in the region of (z<0) and has been subtracted from the measurement by resetting the capacitance meter before taking measurements on each sensor.

Figure 9A:
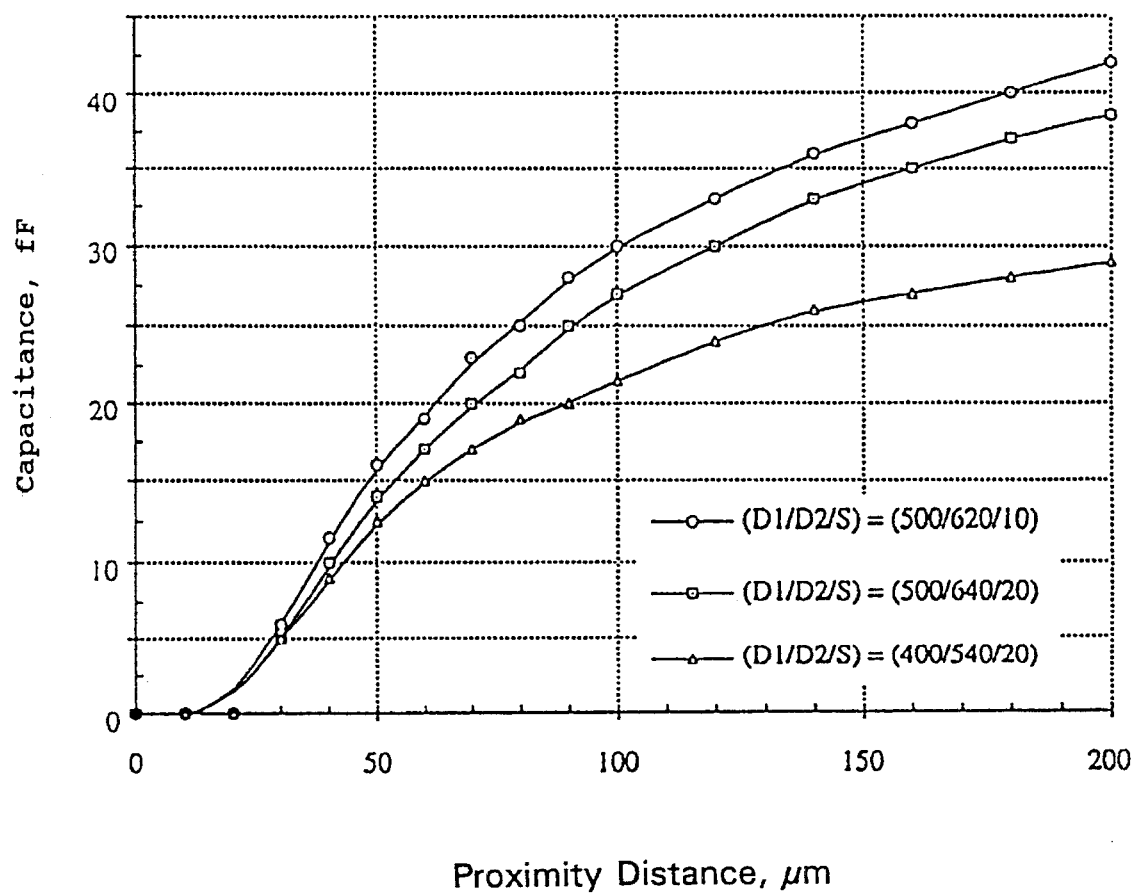
FIGS. 9A–9B show measurement results of applicants' square-shaped proximity sensor having square-shape pattern 1 and square-shape pattern 2, respectively.
Figure 9B:
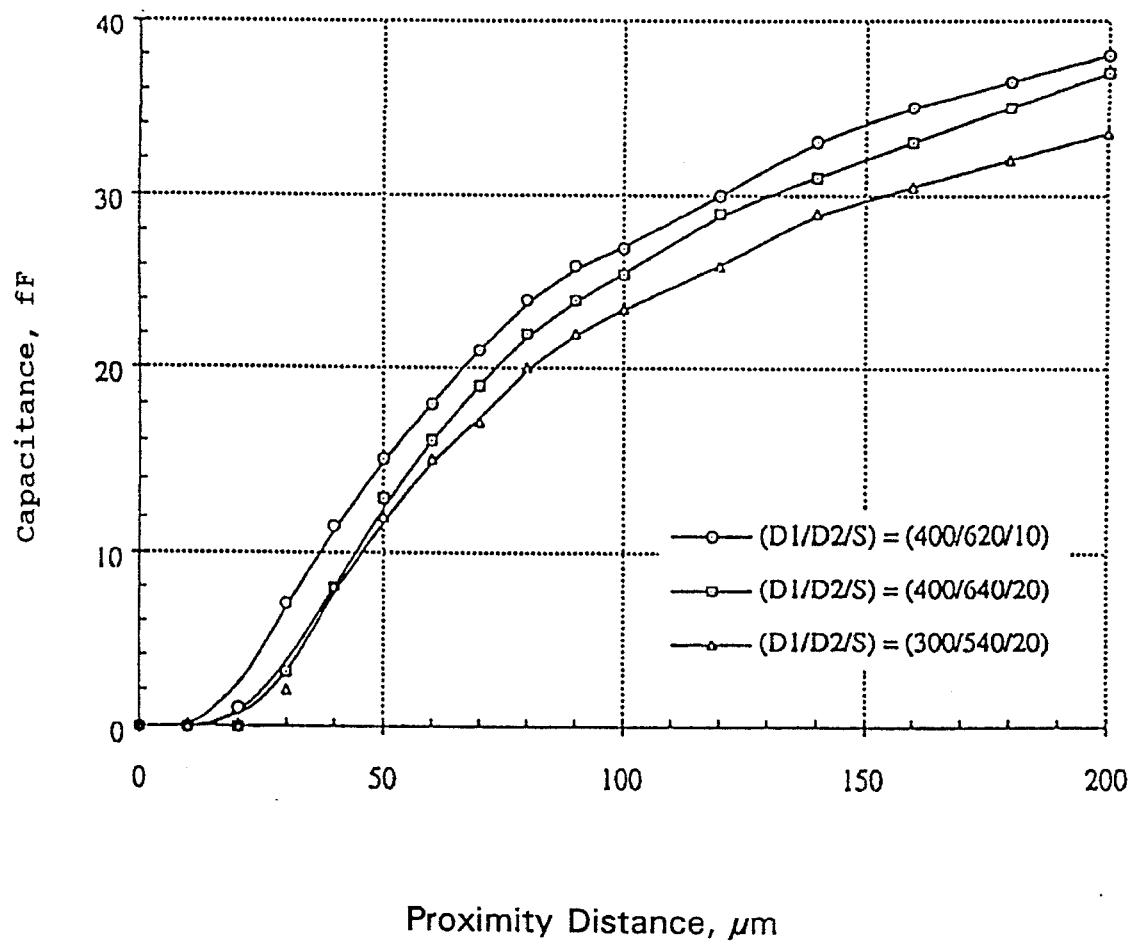
Figure 10A:
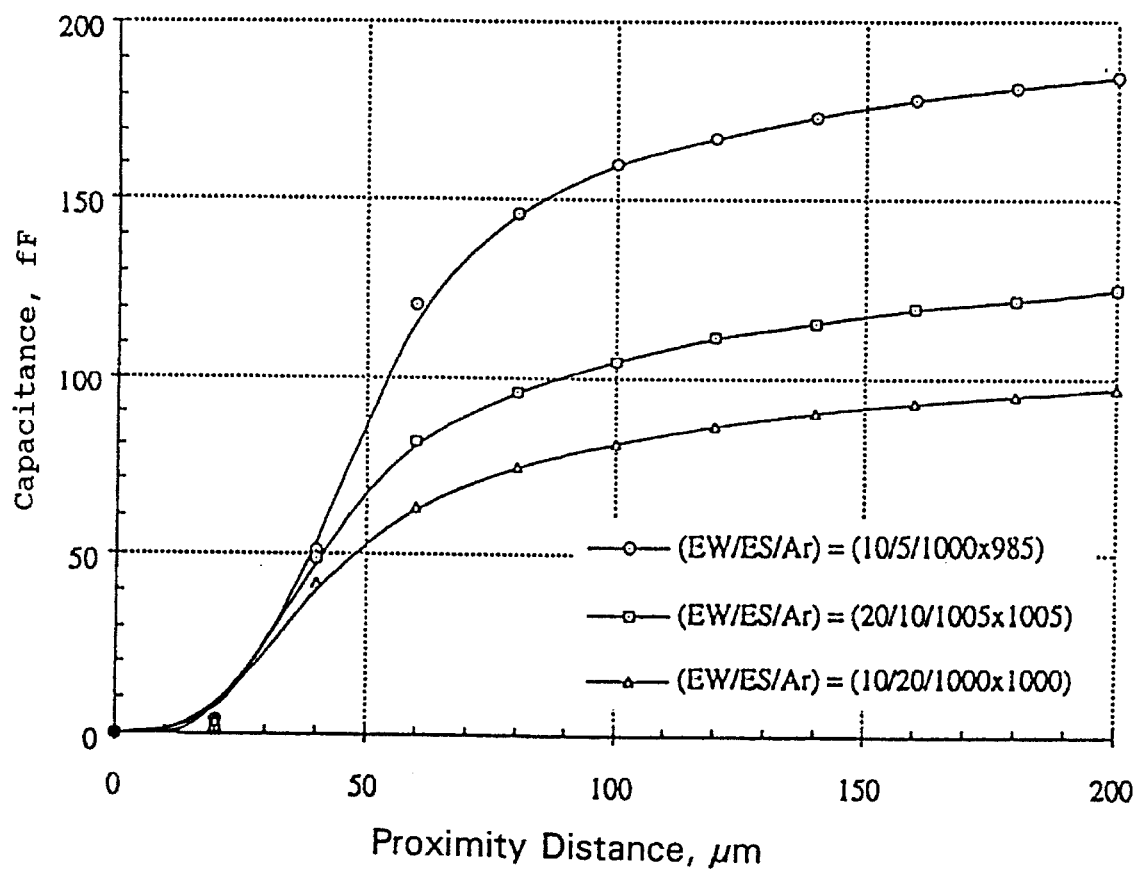
FIGS. 10A–10B show measurement results of applicants' proximity sensors having a comb pattern and spiral pattern, respectively.
Figure 10B:
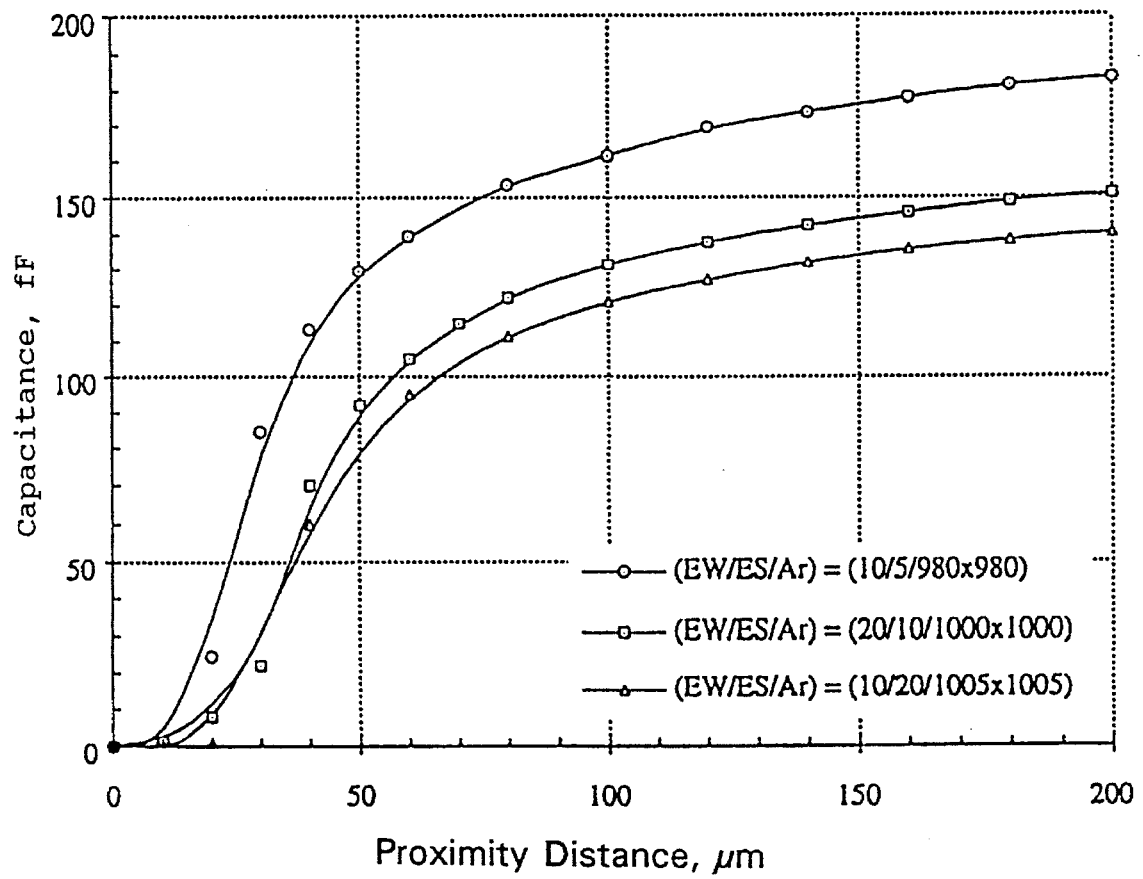
Figure 11A:
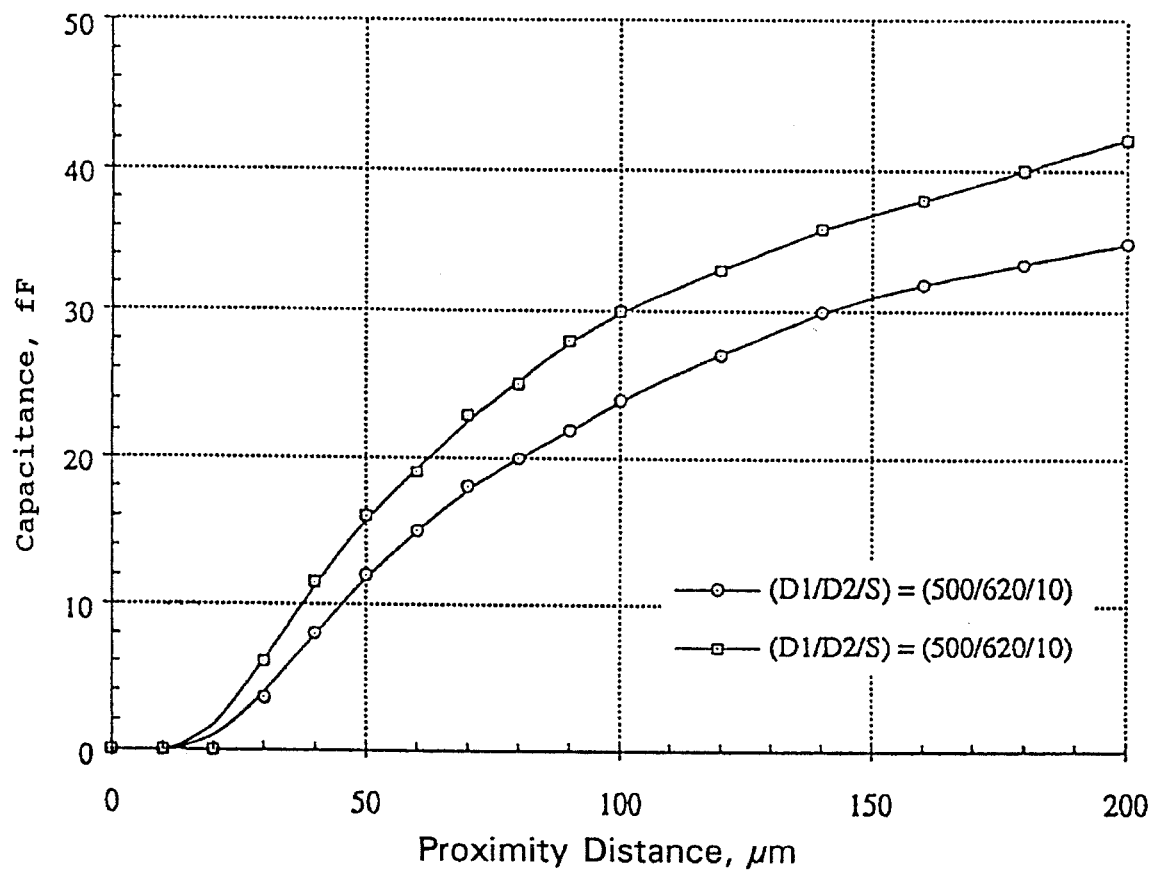
FIGS. 11A–11D show the measurement results of applicants' proximity sensors with the same geometrical parameters but in different groups (on different locations in a substrate) including square-shaped pattern 1 (FIGS. 8A and 8B), comb pattern, and spiral pattern, respectively.
Figure 11B:
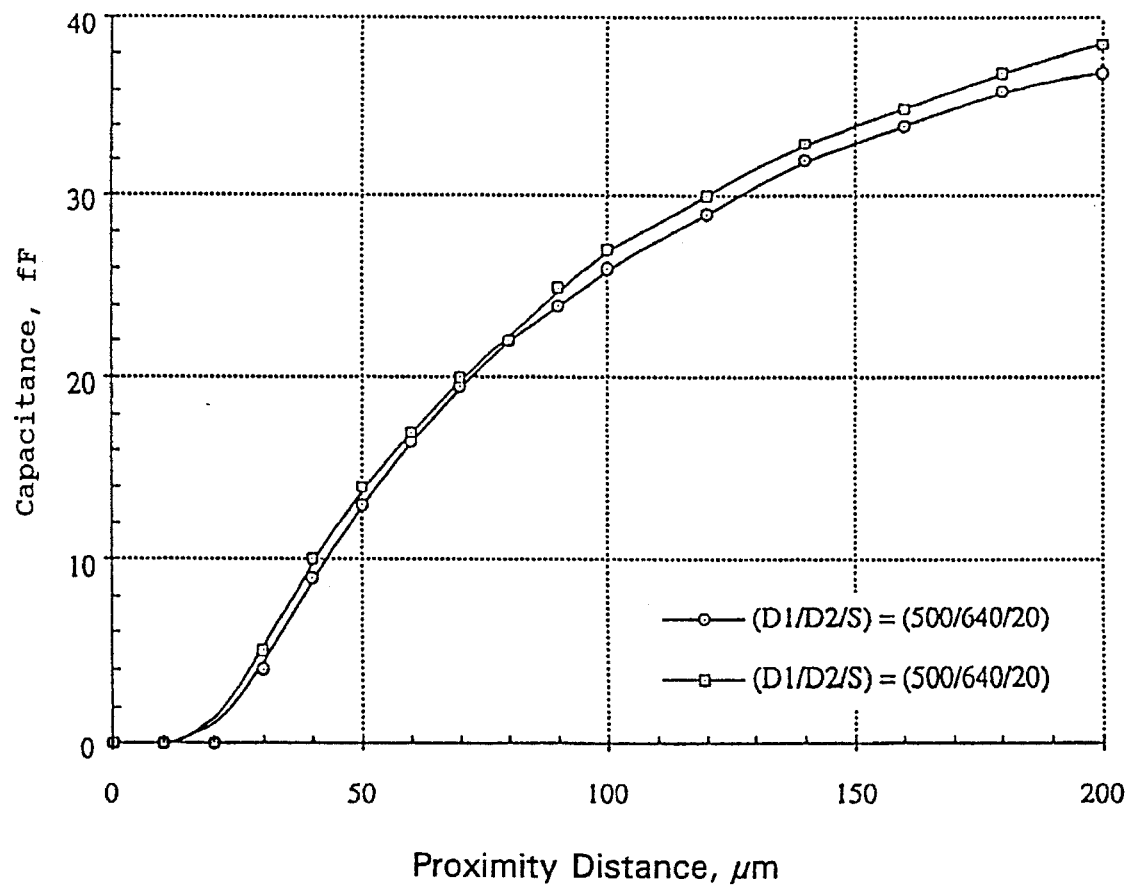
Figure 11C:
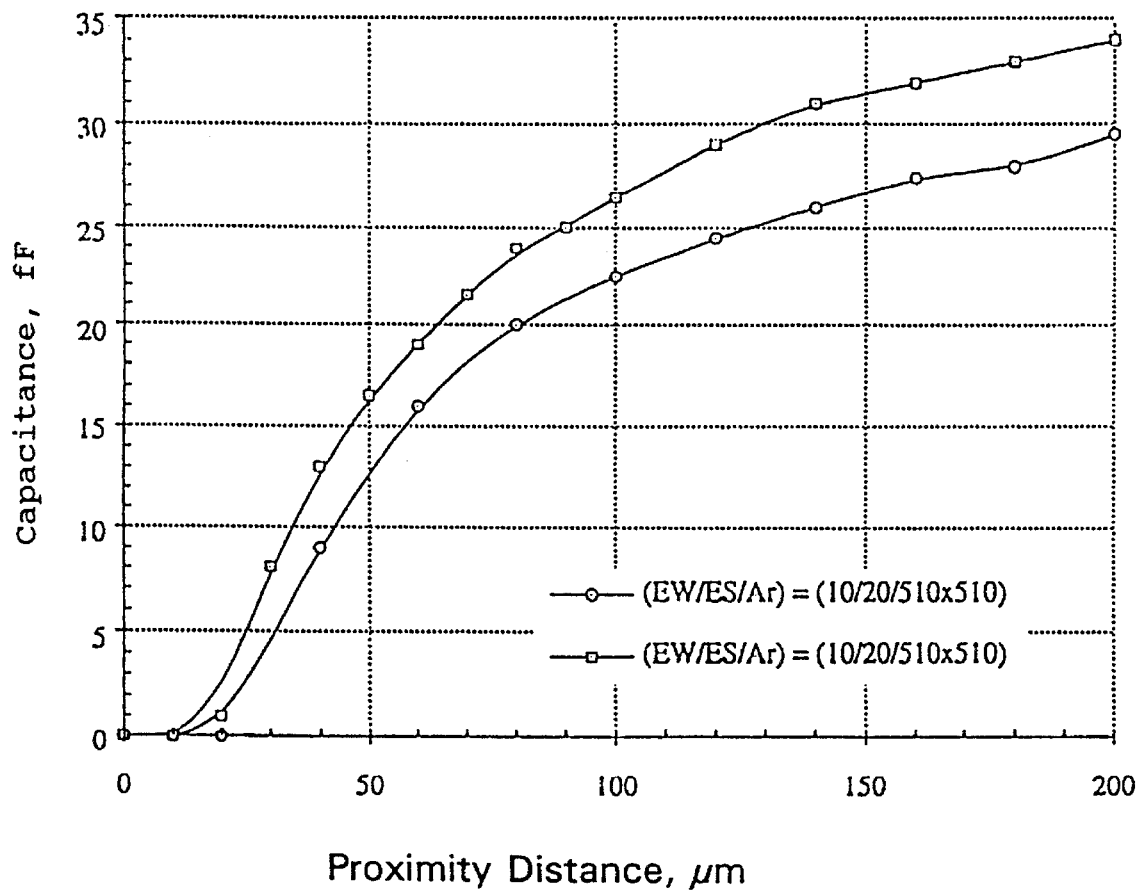
Figure 11D:
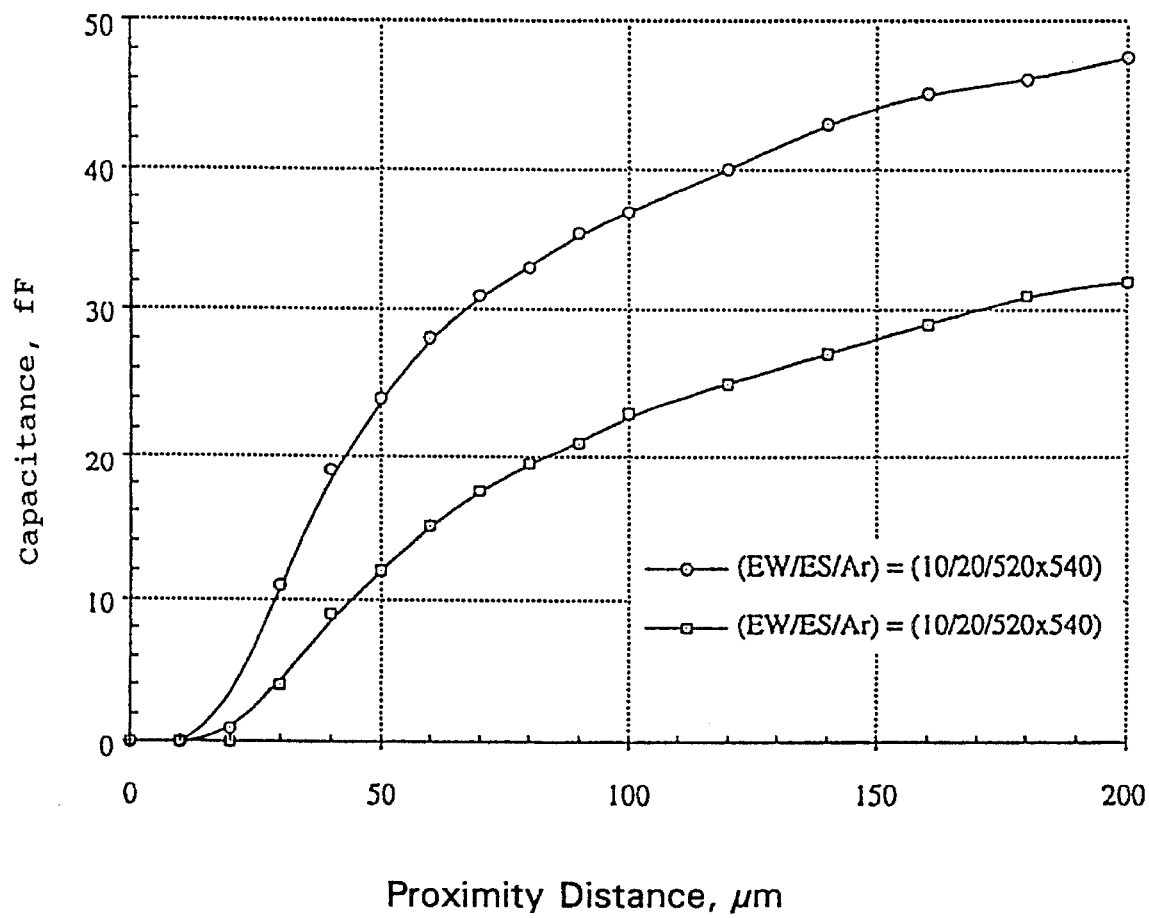

There are three groups of the same proximity sensors in the substrate. FIG. 9A–9B shows the measurement results of the proximity sensors with two square-shaped sensing patterns in one of the three groups. FIG. 10A–10B shows the measurement results of the proximity sensors with a comb pattern and spiral pattern in one of the three groups. FIG. 11A–11D shows the measurement results of the sensors with the same geometrical parameters but in different groups (on different locations in the substrate).

General observations of the measurement results reveal that: (1) the sensitivity is inversely proportional to the electrode separation; (2) the linear range of measurement at the near proximity is proportional to the electrode separation; (3) for a given sensor area, the sensitivity is proportional to both effective electrode length and the electrode area; and (4) for the same area of the sensor, the complex sensing patterns have a much higher sensitivity than the square-shaped sensing patterns. Applicants' general observations of the measurement result agree very well with the sensor numerical model simulation results also conducted by applicants using FEM (Finite Element Method) techniques.

Figure 12:
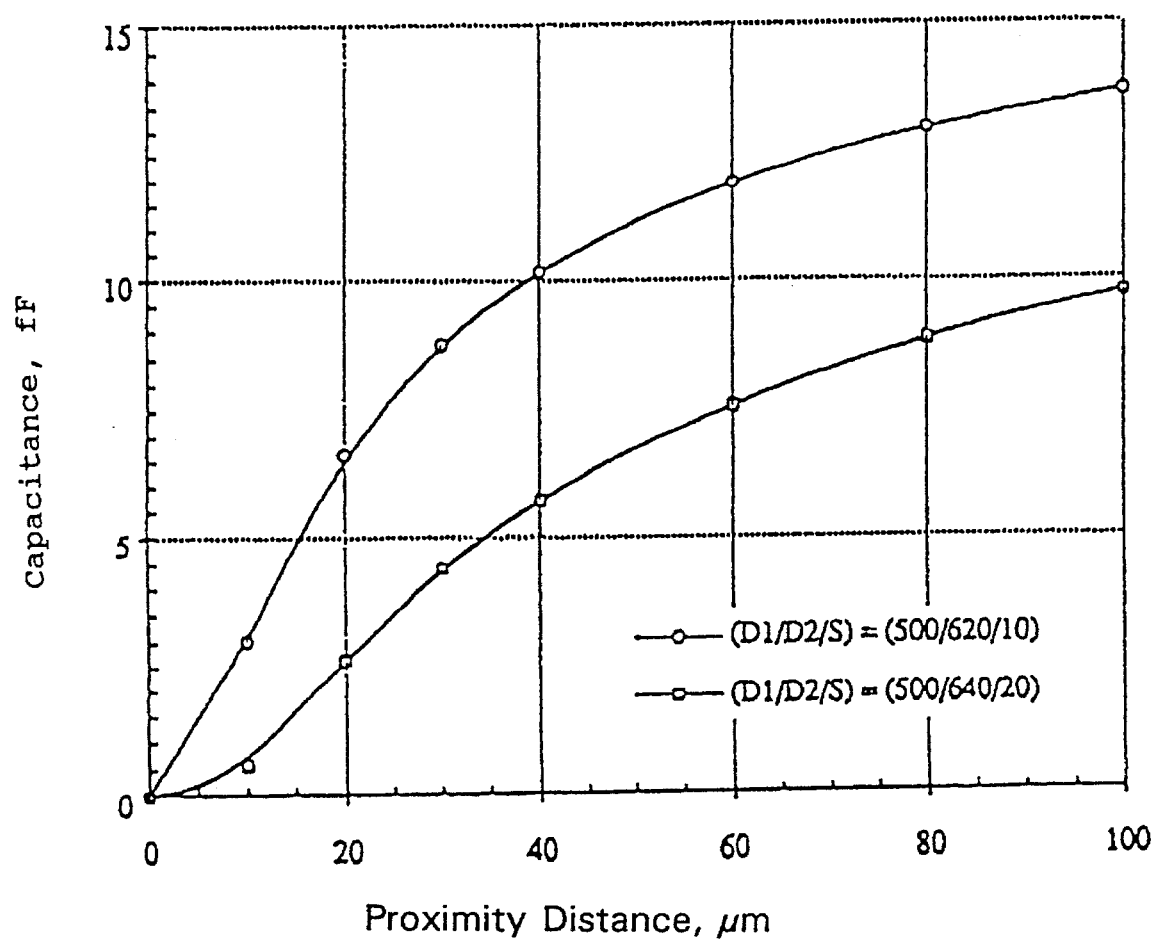
FIG. 12 shows the numerical model simulation results of the proximity sensors with square-shaped sensing pattern 1 (FIGS. 8A and 8B) by using FEM (Finite Element Method) techniques.
Figure 13:
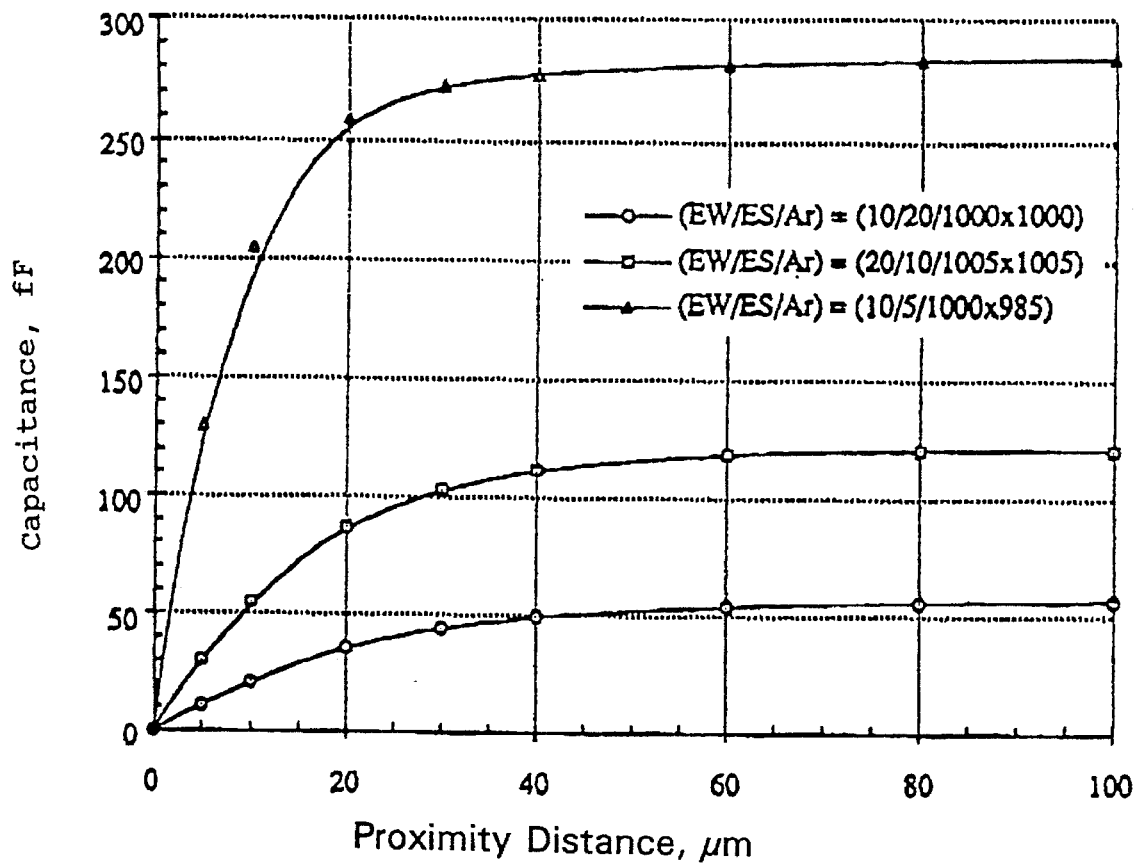
FIG. 13 shows the FEM model simulation results of the comb pattern with the same geometrical patterns as the measured sensors shown in FIG. 10A.

FIG. 12 shows the numerical model simulation results of the proximity sensors with square-shaped sensing pattern 1 (FIGS. 8A and 8B) by using FEM techniques. The simulated sensor model (using FEM numerical modeling on high speed computers) has the same geometrical parameters as the measured sensors in FIG. 9A.

Figure 14:
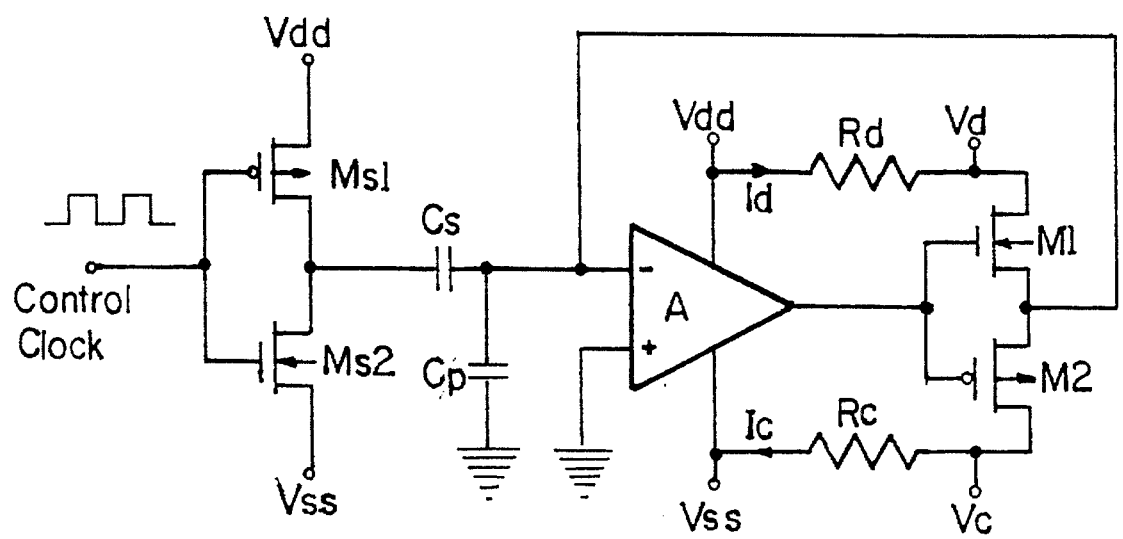
FIGS. 14 and 15 show representative capacitance sensing circuits 1 and 2, respectively.
Figure 15:
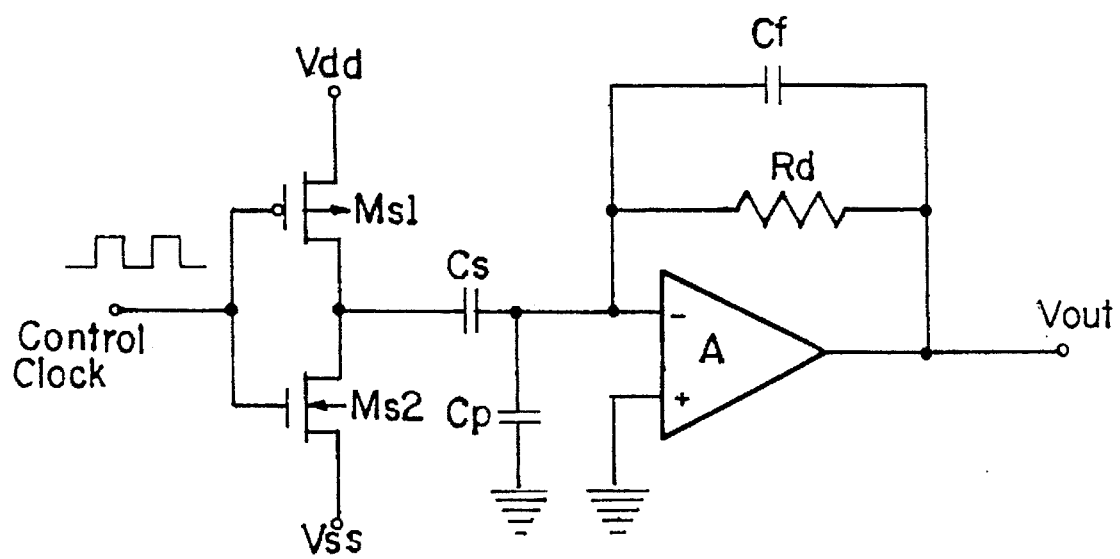

The capacitance change is quite significant for such small sensing structures. There are no fundamental difficulties in obtaining accurate measurement of such small capacitance changes with modern capacitance measurement techniques. Since the fabrication of the proposed proximity sensor is compatible with solid-state processing technology, it is feasible to integrate the capacitance measurement circuitry with the sensor itself to form a "smart sensor". The integration of the sensor with its processing circuitry will certainly offer a much improved quality on the sensor measurement results. Representative capacitance measurement circuitry would consist of Op-Amp as voltage comparator, sensing capacitor ($C_x$), transistors ($M_1$ and $M_2$) and resistors (Rc and $R_d$) in a circuits as shown in FIGS. 14 and 15.

Two Alternative Embodiments of Proximity Sensor

Figure 16:
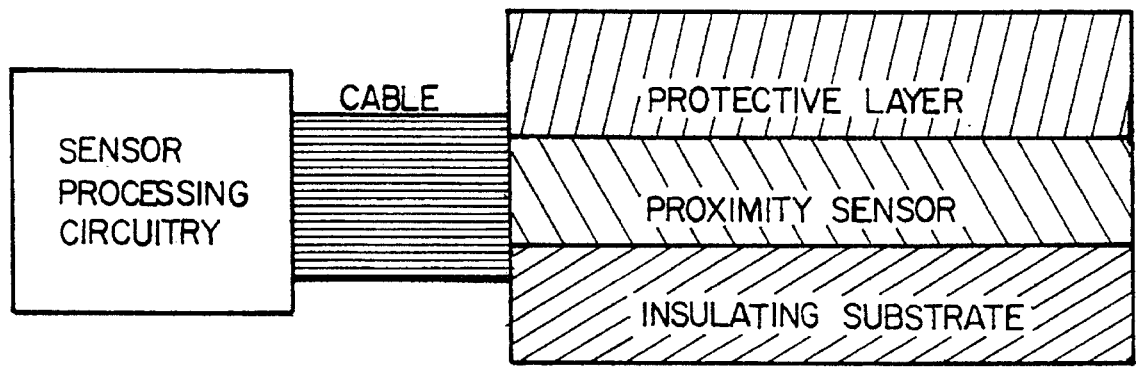
FIG. 16 is a diagram of a first embodiment of applicants' proximity sensor wherein the processing circuit is not an integral part of the proximity sensor.

Applicants contemplate at least two (2) basic embodiments of the proximity sensor of the invention. The first embodiment of the proximity sensor (described hereinabove) provides for constructing the proximity sensor on an insulating substrate without integration with its associated capacitance measurement processing circuitry (see FIGS. 14 and 15). In this embodiment, the sensor is connected to suitable capacitance measurement processing circuitry by suitable cables (such as heat seal connectors) or other electrical connectors. A simple schematic view of this type of proximity sensor is shown in FIG. 16.

A second embodiment of proximity sensor in accordance with the present invention (not described hereinabove) contemplates fabricating the proximity sensor and its capacitance measurement processing circuitry together as an integral unit. In this embodiment, the substrate utilized must be able to hold the sensor processing circuitry or, in other words, the sensor processing circuitry must be able to be fabricated on the substrate. Suitable substrates include silicon (Si), gallium arsenic (GaAs) and SOI (silicon on insulator). As can be appreciated, capacitance measurement processing circuitry cannot be fabricated on insulating substrates or flexible insulating films.

The basic processing sequence to form the integrated proximity sensor provides for first fabricating the sensor processing circuitry on a proper substrate (Si, GaAs, etc.) in the same manner as conventional integrated circuits are fabricated. Next, an insulating layer is deposited on top of the finished sensor processing circuitry (for example, several micrometers of polyimide film or the like). The sensor is then fabricated on the deposited insulating layer as described hereinabove with respect to the first embodiment of the invention wherein a suitable metal is sputtered onto the layer and then subsequently patterned by photolithography and etched. Finally, a dielectric material protective layer (for example, silica carbide) is deposited on top of the finished proximity sensor.

Figure 17:
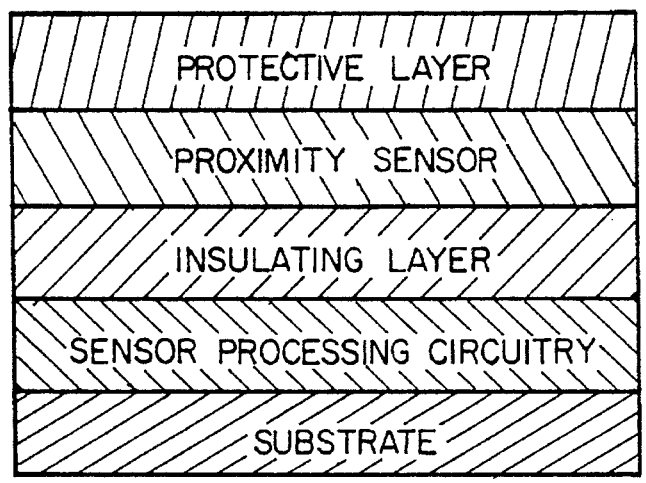
FIG. 17 is a diagram of a second embodiment of applicants' proximity sensor wherein the processing circuit is an integral part of the proximity sensor.

It should be appreciated that the capacitance measurement processing circuitry can only be fabricated on silicon (Si), gallium arsenic (GaAs) or other proper substrates and cannot be fabricated directly onto insulating substrates such as silica ($SiO_2$), sapphire ($Al_2O_3$) or flexible dielectric films. A simple schematic of a representative sensor in accordance with the second embodiment of the present invention is shown in FIG. 17.

It will be understood that various details of the invention may be changed without departing from the scope of the invention. Furthermore, the foregoing description is for the purpose of illustration only, and not for the purpose of limitation—the invention being defined by the claims.

What is claimed is:

1. A solid-state fringe effect micro capacitive proximity sensor, said proximity sensor comprising:

an insulating substrate;

a plurality of sensing electrodes formed on said insulating substrate in closely spaced relationship and without any screen element therebetween, said electrodes adapted to measure the proximity distance of a target object by means of the fringe capacitance effects created between said electrodes and wherein the distance range between said electrodes is 1 micrometer to electrode width; and capacitance measurement processing circuitry electrically connected to said plurality of sensing electrodes.

2. A solid-state fringe effect micro capacitive proximity sensor according to claim 1 wherein said insulating substrate comprises silica ($SiO_2$) wafer.

3. A solid-state fringe effect micro capacitive proximity sensor according to claim 1 wherein said insulating substrate comprises sapphire ($Al_2O_3$) wafer.

4. A solid-state fringe effect micro capacitive proximity sensor according to claim 1 wherein said insulating substrate comprises flexible polyimide film.

5. A solid-state fringe effect micro capacitive proximity sensor according to claim 1 wherein said plurality of sensing electrodes comprises an etch of a chrome layer.

6. A solid-state fringe effect micro capacitive proximity sensor according to claim 1 wherein said plurality of sensing electrodes comprises an etch of gold and chrome layers.

7. A solid-state fringe effect micro capacitive proximity sensor according to claim 1 wherein said plurality of electrodes defines a plurality of concentric circles pattern.

8. A solid-state fringe effect micro capacitive proximity sensor according to claim 1 wherein said plurality of electrodes defines a plurality of concentric squares pattern.

9. A solid-state fringe effect micro capacitive proximity sensor according to claim 1 wherein said plurality of electrodes defines a comb pattern.

10. A solid-state fringe effect micro capacitive proximity sensor according to claim 1 wherein said capacitance measurement processing circuitry is electrically connected to but spaced-apart from said insulating substrate and is fabricated on a non-insulating substrate.

11. A solid-state fringe effect capacitive proximity sensor according to claim 1 wherein said capacitance measurement processing circuitry is formed as an integral part of said proximity sensor.

12. A solid-state fringe effect micro capacitive proximity sensor according to claim 1 wherein a protective layer is provided over said sensing electrodes.

13. A solid-state fringe effect micro capacitive proximity sensor, said proximity sensor comprising:

a substrate;

capacitance measurement processing circuitry formed on said substrate so as to become an integral part of said proximity sensor;

an insulating layer deposited on the combination of processing circuitry and substrate; and a plurality of sensing electrodes formed on said insulating layer in closely spaced relationship and without any screen element therebetween, said electrodes being electrically connected to said processing circuitry and adapted to measure the proximity distance of a target object by means of the fringe capacitance effects created between said electrodes and wherein the distance range between said electrodes is 1 micrometer to electrode width.

14. A solid-state fringe effect micro capacitive proximity sensor according to claim 13 wherein said substrate comprises silicon (Si) wafer.

15. A solid-state fringe effect micro capacitive proximity sensor according to claim 13 wherein said substrate comprises gallium arsenic (GaAs) wafer.

16. A solid-state fringe effect micro capacitive proximity sensor according to claim 13 wherein said plurality of sensing electrodes comprises an etch of a chrome layer.

17. A solid-state fringe effect capacitive proximity sensor according to claim 13 wherein said plurality of sensing electrodes comprises an etch of gold and chrome layers.

18. A solid-state fringe effect micro capacitive proximity sensor according to claim 13 wherein said plurality of electrodes defines a plurality of concentric circles pattern.

19. A solid-state fringe effect micro capacitive proximity sensor according to claim 13 wherein said plurality of electrodes defines a plurality of concentric squares pattern.

20. A solid-state fringe effect micro capacitive proximity sensor according to claim 13 wherein said plurality of electrodes defines a comb pattern.

21. A solid-state fringe effect micro capacitive proximity sensor according to claim 13 wherein said insulating layer comprises polyimide film.

22. A solid-state fringe effect micro capacitive proximity sensor according to claim 13 wherein a protective layer is provided over said sensing electrodes.

23. A state fringe effect micro capacitive proximity sensor according to claim 10 wherein the non-insulating substrate is selected from the group consisting of silicon and gallium-arsenic.

* * * * *